United States Patent
Junghans et al.

(10) Patent No.: US 7,456,855 B2
(45) Date of Patent: Nov. 25, 2008

(54) METHOD FOR IMAGE GENERATION ON A RECORDING MATERIAL

(75) Inventors: Gerd Junghans, Schwetzingen (DE); Claus Seibert, Heidelberg (DE)

(73) Assignee: Heidelberger Druckmaschinen AG, Heidelberg (DE)

(*) Notice: Subject to any disclaimer, the term of this patent is extended or adjusted under 35 U.S.C. 154(b) by 219 days.

(21) Appl. No.: 11/396,022

(22) Filed: Mar. 31, 2006

(65) Prior Publication Data
US 2006/0219118 A1 Oct. 5, 2006

(30) Foreign Application Priority Data
Mar. 31, 2005 (DE) .................. 10 2005 015 041

(51) Int. Cl.
*B41J 2/45* (2006.01)
*B41J 2/47* (2006.01)
*B41J 2/435* (2006.01)

(52) U.S. Cl. .................. 347/238; 347/234; 347/248
(58) Field of Classification Search .................. 347/224, 347/241, 233–235, 238, 248–250
See application file for complete search history.

(56) References Cited

U.S. PATENT DOCUMENTS

| | | | |
|---|---|---|---|
| 5,848,082 A * | 12/1998 | Shum | 372/36 |
| 5,926,203 A | 7/1999 | Shimura et al. | |
| 6,043,456 A * | 3/2000 | Meyer et al. | 219/216 |
| 6,765,604 B2 * | 7/2004 | Beier et al. | 347/233 |
| 6,862,034 B2 * | 3/2005 | Ernst et al. | 347/233 |
| 2004/0145646 A1 * | 7/2004 | Detmers et al. | 347/242 |
| 2004/0252181 A1 * | 12/2004 | Seibert | 347/241 |
| 2005/0104952 A1 * | 5/2005 | Haushahn et al. | 347/224 |

FOREIGN PATENT DOCUMENTS

| | | |
|---|---|---|
| DE | 196 17 552 A1 | 11/1997 |
| JP | 6-115160 | 4/1994 |

* cited by examiner

*Primary Examiner*—Hai C Pham
(74) *Attorney, Agent, or Firm*—Laurence A. Greenberg; Werner H. Stemer; Ralph E. Locher

(57) ABSTRACT

A method for image generation on a recording material reduces the nonlinear spacing error between individual beams. In the method for image generation on a recording material, in which, in order to produce recording points on the recording material, individual radiation sources are used which are disposed along a line on a carrier material and in which the individual radiation sources are driven in accordance with an image and the individual beams are imaged onto a radiation-sensitive layer of the recording material. The spacing of the recording points on the recording material is set by length changes in the direction of the line being produced thermally in the carrier material.

4 Claims, 4 Drawing Sheets

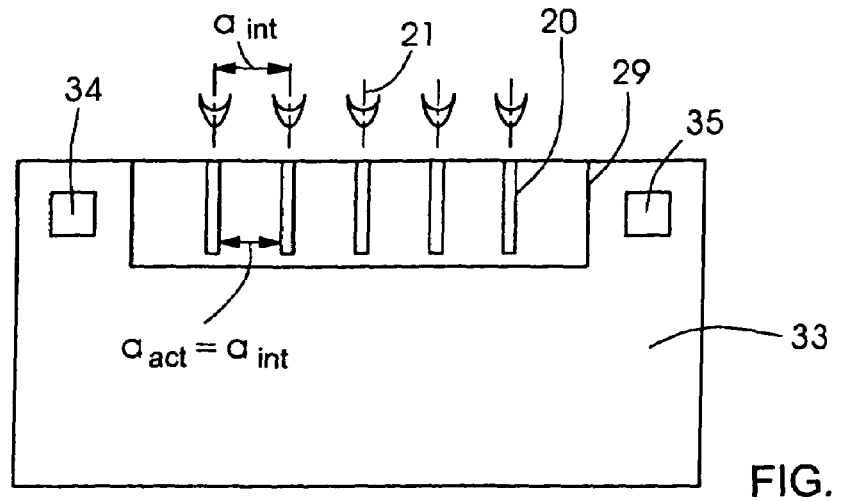
FIG. 4.1
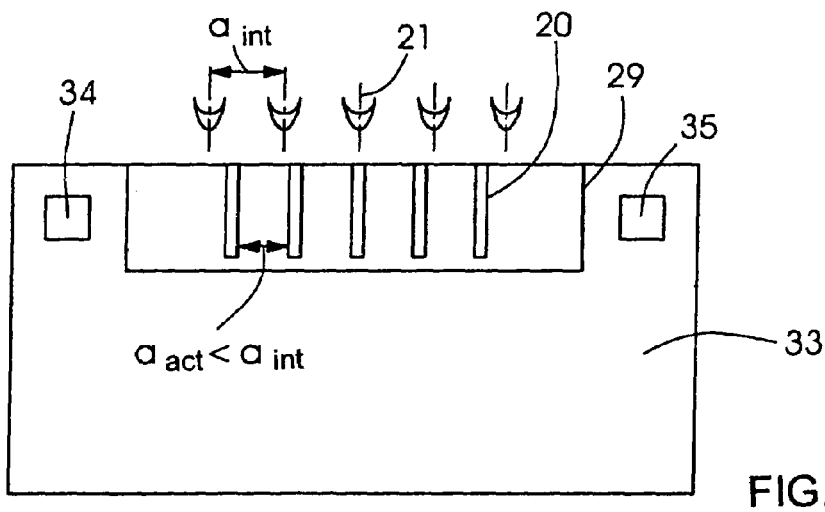
FIG. 4.2
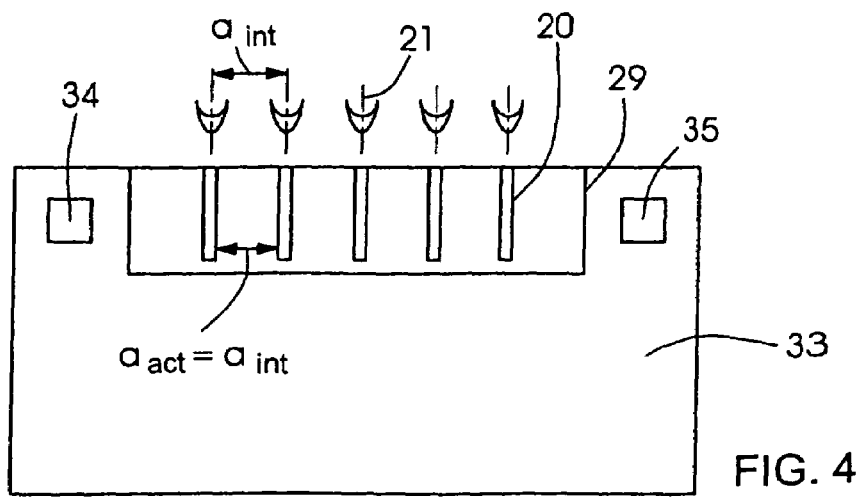
FIG. 4.3

METHOD FOR IMAGE GENERATION ON A RECORDING MATERIAL

BACKGROUND OF THE INVENTION

Field of the Invention

The invention relates to a method for image generation on a recording material. In order to produce recording points on the recording material, individual radiation sources are used which are disposed along a line on a carrier material, in which the individual radiation sources are driven in accordance with an image and the individual beams are imaged onto a radiation-sensitive layer of the recording material.

Published, non-prosecuted German patent application DE 100 31 915 A1, corresponding to U.S. Pat. No. 6,784,912, discloses a method for imaging a printing plate in which, by using an array containing a large number of laser light sources that can be driven individually in accordance with an image, image points are produced on the printing plate in a pattern. Micro-optics are used for beam shaping. Macro-optics image the individual beams in three spatial directions at a desired position on a photosensitive layer of the printing plate. By a relative movement between the laser light sources and the printing form, the entire surface of the printing form is covered. The laser light sources are disposed at equal intervals along a line.

The beam positions in the direction perpendicular to the cylinder axis must not deviate from the respective intended position by more than 1 µm. Exceeding this tolerance leads to image defects in the form of hairlines between adjacent imaging tracks and/or to moiré phenomena.

During the production of a laser diode array, the individual laser diodes can be positioned highly accurately in relation to one another by lithographic processes. Typical spacing deviations between the laser diodes lie in the range <0.1 µm. Since laser diodes heat up during operation, the laser diode array is mounted on a highly thermally conductive carrier material. Following the mounting, mechanical stresses arise in the laser diode array, which lead to deformations in all spatial directions. In the longitudinal direction of the laser diode array, this leads to enlargements and reductions in the size of the spacing of adjacent laser diodes. The spacing errors are magnified by micro-optics disposed downstream of the laser diode array. A further magnification of the spacing error is avoided if the macro-optics, as described in published, non-prosecuted German patent application DE 102 33 491 A1, corresponding to U.S. Pat. No. 6,919,997, effect telecentric, 1:1 imaging of the individual beams. In order to reduce the mounting-induced stresses in the laser diode array, it has already been proposed, in U.S. Pat. No. 5,848,082, to match the thermal coefficients of expansion of the laser diode array and of the carrier material to each other. The spacing errors are thereby reduced only for a reference temperature. The temperature relationships are affected highly by the number of image points to be placed.

That which is stated above also applies if laser diodes are disposed in a plurality of rows, as described in German Utility Model DE 93 02 494 U1 and published, non-prosecuted German patent application DE 198 27 423 A1, corresponding to U.S. Pat. No. 5,995,475.

In published, non-prosecuted German patent application DE 196 17 552 A1, corresponding to U.S. Pat. No. 6,043,456, a method for regulating the temperature in a printing plate labeling unit operating with laser light is described, in which each laser diode is assigned a heating element. The heating element is the actuating element of a control loop in order to keep the temperature of a laser diode substantially constant during the labeling operation. The purpose is to avoid fluctuations in the beam power, which lead to quality deficiencies in the printed image. As a result of keeping the temperature of the laser diodes constant, the spacing between the laser diodes is also kept constant.

In order to achieve optimal driving of a laser diode array, in addition to laser diodes, a memory module and a sensor are provided in the solution according to U.S. Pat. No. 5,734,672. The operating data for driving the laser diodes is stored in the memory module. In conjunction with an external computer, the operating data can be updated regularly.

In a solution according to U.S. Pat. No. 4,884,279, the influence of the ambient temperature on the radiation power of a semiconductor laser is reduced by a temperature control loop and a power control loop.

U.S. Pat. No. 4,399,541 discloses a semiconductor laser which is cooled by a temperature sensor and a Peltier element.

In the semiconductor laser device according to published, non-prosecuted German patent application DE 33 42 111 A1, corresponding to U.S. Pat. No. 4,604,753, a pn junction is used to register temperature. By using the temperature-dependent changes in the forward voltage of the laser diode and of the pn junction, a thermoelectric heat pump is driven, which cools the laser device to a predefined temperature. This ensures that the laser device provides a prescribed optical output at every time.

SUMMARY OF THE INVENTION

It is accordingly an object of the invention to provide a method for image generation on a recording material which overcomes the above-mentioned disadvantages of the prior art methods of this general type, in which the nonlinear spacing error between individual beams is reduced.

With the foregoing and other objects in view there is provided, in accordance with the invention, a method for image generation on a recording material. The method includes producing recording points on the recording material using individual radiation sources disposed along a line on a carrier material. The individual radiation sources are driven in accordance with a desired image. The individual beams are imaged onto a radiation-sensitive layer of the recording material. A spacing of the recording points on the recording material is controlled by setting length changes in a direction of the line being produced thermally in the carrier material.

According to the invention, the spacings of individual radiation sources are set by longitudinal thermal expansion in such a way that the spacing error is minimal. Individual radiation sources in the sense of the invention are light sources, such as laser diodes or light-emitting diodes, or heat sources or inkjet print heads for the production of an image on a printing form or printing material, by coating, removal, property changing or reshaping. The thermal constancy of the overall length of an array of individual radiation sources can be achieved by at least one heating element being disposed in the environment of the array and being driven in such a way that the current thermal output remains constant over all the individual radiation sources during an imaging procedure.

When laser diode arrays are used, the laser diodes themselves can be used as heating elements. For this purpose, unused laser diodes are operated with a forward current which heats the respective laser diode but does not yet reach the output threshold for imaging.

Other features which are considered as characteristic for the invention are set forth in the appended claims.

Although the invention is illustrated and described herein as embodied in a method for image generation on a recording material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4.1-4.3 are diagrammatic illustrations relating to the action of heating elements in a configuration according to FIG. 3.

DESCRIPTION OF THE PREFERRED EMBODIMENTS

Figure 1:
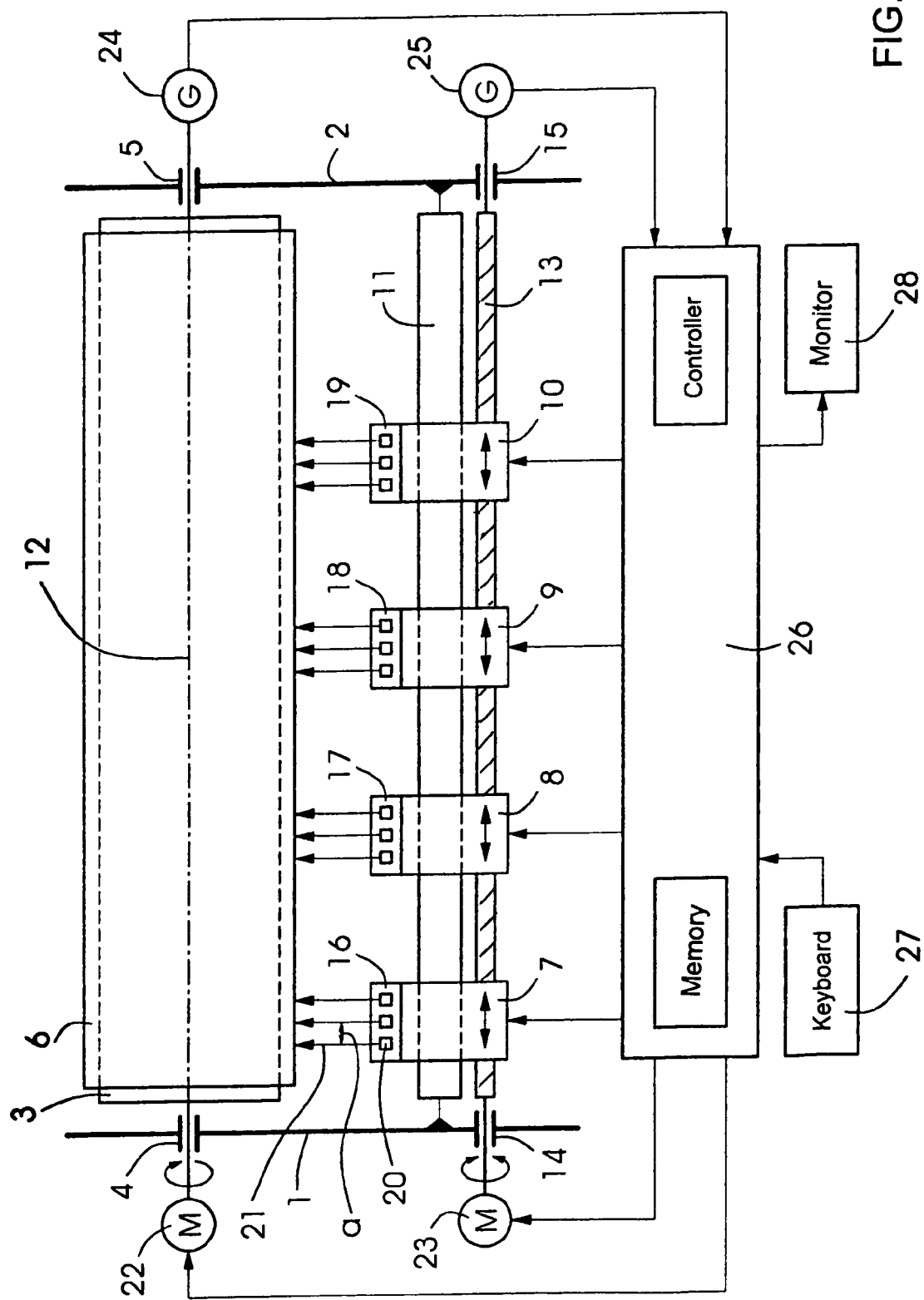
FIG. 1 is a diagrammatic, plan view of a printing unit with an integrated imaging device according to the invention.

Referring now to the figures of the drawing in detail and first, particularly, to FIG. 1 thereof, there is shown a schematic illustration of a printing unit of a press with an integrated imaging device. Between side walls 1, 2, a printing form cylinder 3 is held in bearings 4, 5 so that it can rotate. A printing form blank 6 is clamped on the printing form cylinder 3. To generate image points accepting printing ink on a surface of the printing form blank 6, four imaging heads 7-10 are provided. The imaging heads 7-10 are disposed on a longitudinal guide 11. The longitudinal guide 11 is located parallel to an axis of rotation 12 of the printing form cylinder 3. The imaging heads 7-10 can be positioned together in a direction of the axis of rotation 12 by a spindle drive 13. The spindle drive 13 is held in bearings 14, 15 in the side walls 1, 2 so that it can rotate.

The imaging heads 7-10 contain laser diode arrays 16-19 including optically imaging elements. The laser diode array 16-19 contains 64 individually drivable laser diodes 20, which are aligned on a line parallel to the axis of rotation 12. The spacing "a" of the laser diodes 20 in the direction of the axis of rotation 12 is greater than the minimal spacing between two image points to be produced. When a laser diode 20 is driven, a laser beam 21 is produced perpendicular to the axis of rotation 12.

The printing form cylinder 3 and the spindle drive 13 are in each case coupled to motors 22, 23 and rotary encoders 24, 25. The imaging heads 7-10, the motors 22, 23 and the rotary encoders 24, 25 are connected to a control device 26. The control device 26 contains computational measures for controlling the press during printing and during imaging. A keyboard 27 permits the entry of data by an operator. A monitor 28 is used to display control information.

Figure 2:
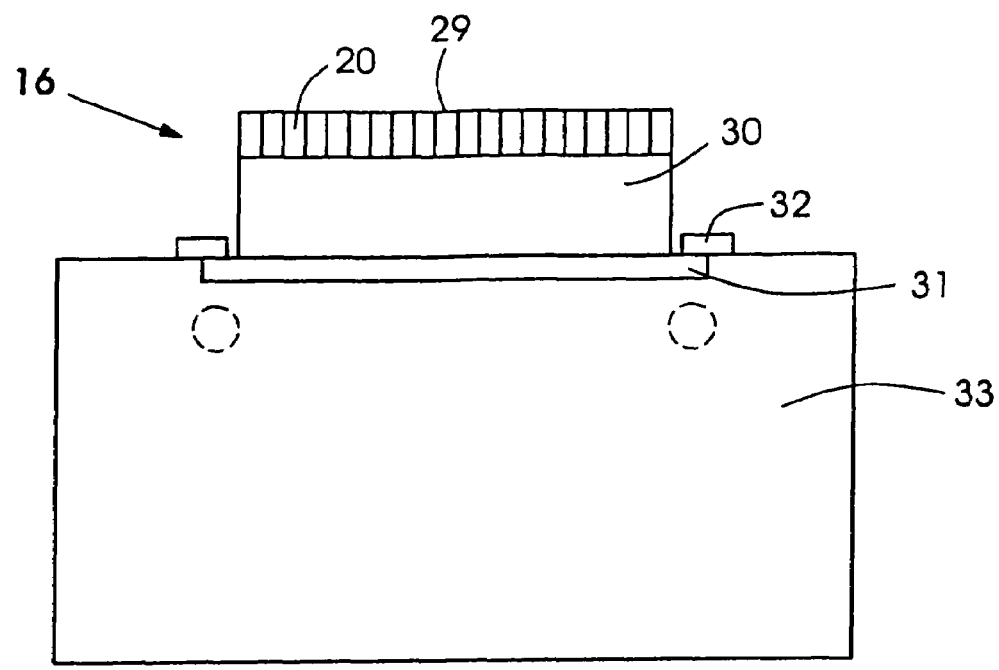
FIG. 2 is a diagrammatic, plan view of the imaging device having a heating element under a laser bar carrier.

FIG. 2 shows a possible structure of the laser diode array 16-19 with a view counter to the direction of the laser beams 21. The 64 laser diodes 20 form a laser bar 29, which is disposed on a laser bar carrier 30. Underneath the laser bar carrier 30 there is a heating resistor 31 having two terminals 32 which are connected to the control device 26. The heating resistor 31 is embedded in a heat sink 33. There is very good thermal contact between the laser bar 29, the laser bar carrier 30 and the heating resistor 31.

During the production of a printing image on the printing form blank 6, the laser diodes 20 of all the laser diode arrays 16, 19 are driven in accordance with an image, while the printing form cylinder 3 rotates and the imaging heads 7-10 are moved continuously parallel to the axis of rotation 12 by the spindle drive 13. With the exception of a full-tone region, not all the laser diodes 20 are driven for a printing image. In the case of printing images with a low area coverage, only a few laser diodes 20 are driven, so that the heat loss in the laser bar 29 is correspondingly low. The current temperature of the laser bar 29 can be registered by a sensor or results from the imaging data in the form of a table or a characteristic curve or by calculation. For the laser bar 29, an intended temperature is predefined. At the intended temperature, the laser bar 29 has a longitudinal extent at which the centers of gravity of the beam outputs from the laser diodes 20 have a desired spacing. If only a few laser diodes 20 are used for imaging, then, without the additional supply of heat, this would lead to the spacing between the centers of gravity shrinking. By driving the heating elements 31 by the control device 26, so much heat is supplied to the laser bar 29 that the intended temperature is established on the laser bar 29. In the event of a changing number of the laser diodes 20 used, the heat output from the heating resistor 31 is controlled in such a way that the actual temperature equals the intended temperature.

Figure 3:
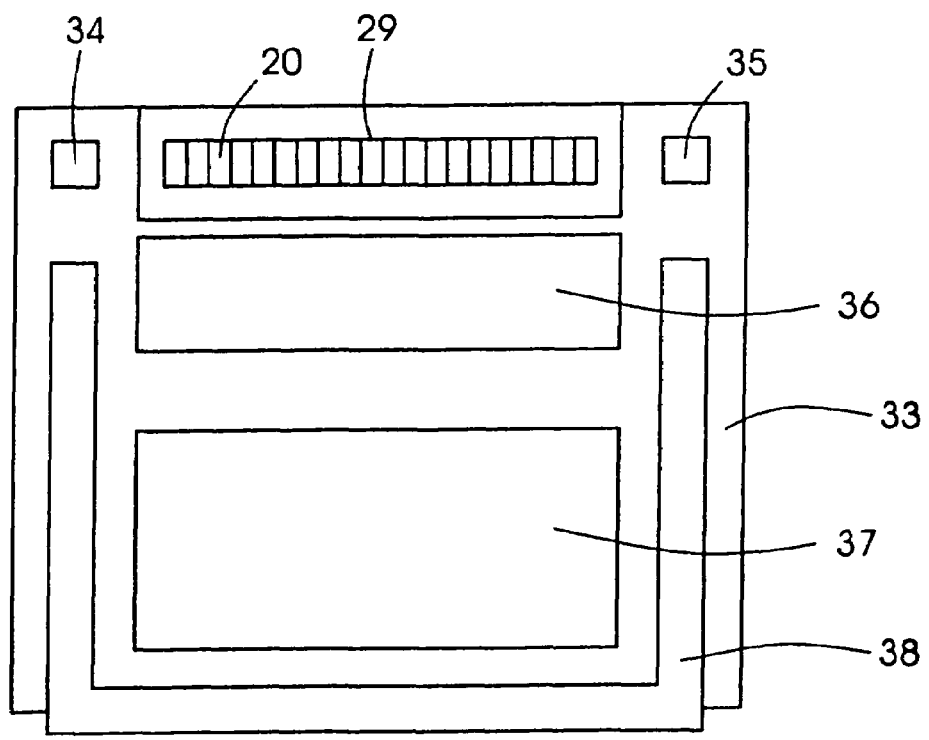
FIG. 3 is a diagrammatic, plan view of the imaging device having two heating elements at a side of a laser bar.

FIG. 3 shows in plan view a variant having two heating elements 34, 35 in the longitudinal direction beside the laser bar 29 on the heat sink 33. Beside the laser bar 29 there is a photodiode bar 36. For the purpose of power supply and signal processing, a control circuit 37 and a printed circuit board 38 having components is also disposed on the heat sink 33. As a result of the configuration of the heating elements 34, 35 at the sides, the laser bar 29 has very good thermal contact with the heat sink 33. The heating elements 34, 35 are driven as described in relation to FIG. 2. The additional heat is supplied at the side of the laser bar 29 by thermal conduction. The heat supply from the heating elements 34, 35 to the laser bar 29 takes place somewhat delayed.

FIGS. 4.1-4.3 show the action of the configuration according to FIG. 3 by using five laser diodes 20.

If all the laser diodes 20 of the laser bar 29 are driven continuously, then the actual spacing $a_{act}$ corresponds to the intended spacing $a_{int}$, which is shown in more detail in FIG. 4.1. In this case, no additional heating load is required. The heating elements 34, 35 are not driven.

If an image on the printing form blank 6 is imaged with a low area coverage, then only a few laser diodes 20 are driven and heated. As compared with the full load case according to FIG. 4.1, the actual spacings $a_{act}$ would decrease below the intended spacing $a_{int}$ if no additional heat is supplied by the heating elements 34, 35. This case is illustrated in FIG. 4.2.

FIG. 4.3 shows the state after the connection of the heating elements 34, 35. Despite the fact that only a few laser diodes 20 are driven, as described in the case according to FIG. 4.2, the heat originating from the heating elements 34, 35 effects expansion of the laser bar 29, so that the actual spacing $a_{act}$ of the centers of gravity of the distributions of the lines of the laser beams 21 once more corresponds to the intended spacing $a_{int}$. If the number of laser diodes 20 used for the imaging changes, the heating output of the heating elements 34, 35 is readjusted accordingly.

Figure 5:
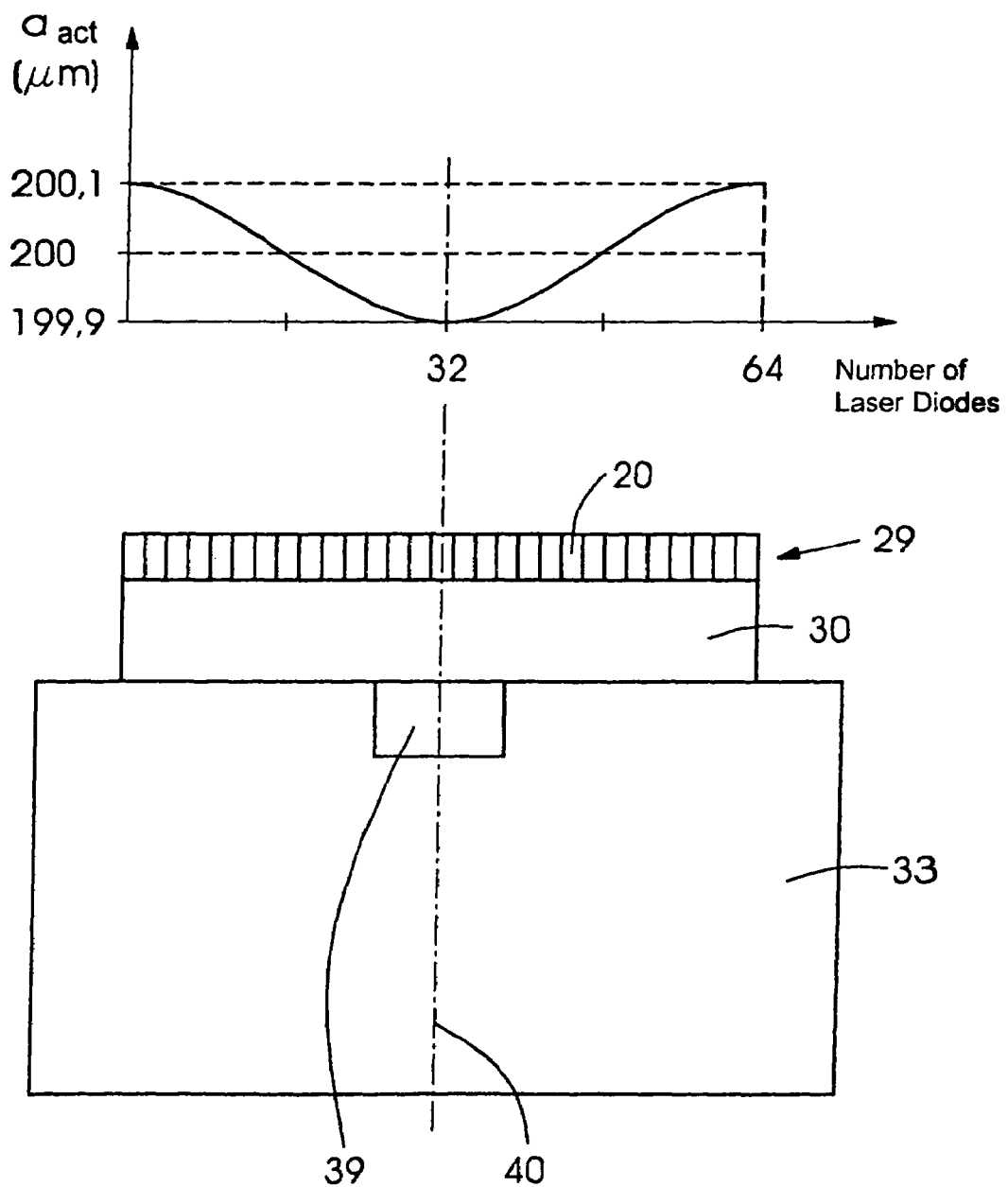
FIG. 5 is a diagrammatic illustration relating to the action of a heating element in a center of a laser bar.

A variant in which a heating element 39 is disposed centrally under the laser bar 29 is illustrated in FIG. 5. The laser bar 29 contains 64 laser diodes 20. The diagram shows the curve of the spacings $a_{act}$ of respectively adjacent laser diodes 20. In the intended state, the laser diodes 20 should have an intended spacing $a_{int}$=200 μm. It can be gathered from the curve that the laser diodes 20 located at the edges of the laser bar 29 are located too far apart, while the laser diodes 20 located in the vicinity of a center 40 are located too closely. If, by using the heating element 39, heat is supplied centrally, then the actual spacings $a_{act}$ of the laser diodes 20 located in the vicinity of the center 40 increase. The curve is linearized.

If a plurality of heating elements 39 are used, it would be possible to drive the heating elements 39 in accordance with any desired curves in order to achieve the aforesaid linearization of the actual spacings $a_{act}$.

This application claims the priority, under 35 U.S.C. §119 of German application DE 10 2005 015 041.1, filed Mar. 31, 2005; the prior application is herewith incorporated by reference in its entirety.

We claim:

1. A method for image generation on a recording material, which comprises the steps of:
   producing recording points on the recording material using individual radiation sources disposed along a line on a carrier material by the steps of:
   driving the individual radiation sources in accordance with an image;
   imaging individual beams onto a radiation-sensitive layer of the recording material;
   controlling a spacing of the recording points on the recording material by setting length changes in a direction of the line being produced thermally in the carrier material;
   determining deviations of spacings of the individual radiation sources from respective intended spacings; and
   producing temperature changes in the carrier material to compensate for the deviations of the spacings.

2. The method according to claim 1, which further comprises
   controlling the length changes by controlling a turn-on time of the individual radiation sources used during the image generation.

3. The method according to claim 1, which further comprises:
   driving a large number of the individual radiation sources that can be driven individually in accordance with the image and which are disposed into the line in an auxiliary scanning direction;
   positioning the recording material relative to the individual radiation sources in a main scanning direction at right angles to the auxiliary scanning direction;
   while the recording material revolves in the main scanning direction on a circular path about an axis of rotation, displacing the individual radiation sources in the auxiliary scanning direction, parallel to the axis of rotation; and
   producing the length changes using at least one heating element connected to the carrier material.

4. The method according to claim 3, which further comprises
   driving the at least one heating element electrically.

* * * * *